United States Patent
Corl, Jr. et al.

(10) Patent No.: US 7,366,728 B2
(45) Date of Patent: Apr. 29, 2008

(54) SYSTEM FOR COMPRESSING A SEARCH TREE STRUCTURE USED IN RULE CLASSIFICATION

(75) Inventors: Everett A. Corl, Jr., Raleigh, NC (US); Gordon T. Davis, Chapel Hill, NC (US); Marco Heddes, Shelton, CT (US); Piyush C. Patel, Cary, NC (US); Ravinder K. Sabhikhi, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 392 days.

(21) Appl. No.: 10/832,634

(22) Filed: Apr. 27, 2004

(65) Prior Publication Data

US 2005/0240604 A1 Oct. 27, 2005

(51) Int. Cl.
*G06F 7/00* (2006.01)
(52) U.S. Cl. ...................................... 707/101
(58) Field of Classification Search ................. 707/101
See application file for complete search history.

(56) References Cited

U.S. PATENT DOCUMENTS

| | | | |
|---|---|---|---|
| 4,868,570 A | 9/1989 | Davis | 341/106 |
| 5,373,290 A | 12/1994 | Lempel et al. | 341/51 |
| 5,374,928 A | 12/1994 | Moore et al. | 341/67 |
| 5,469,161 A | 11/1995 | Bezek | 341/51 |
| 5,485,550 A | 1/1996 | Dalton | 395/51 |
| 5,546,575 A | 8/1996 | Potter et al. | 395/600 |
| 6,070,166 A | 5/2000 | Whittaker et al. | 707/101 |
| 6,192,051 B1 * | 2/2001 | Lipman et al. | 370/389 |
| 6,298,340 B1 * | 10/2001 | Calvignac et al. | 707/3 |
| 6,389,386 B1 | 5/2002 | Hetherington et al. | 704/8 |
| 6,675,163 B1 * | 1/2004 | Bass et al. | 707/6 |
| 2001/0014890 A1 | 8/2001 | Liu et al. | 707/102 |
| 2002/0191605 A1 | 12/2002 | Lunteren et al. | 370/389 |
| 2003/0233516 A1 | 12/2003 | Davis et al. | 711/108 |

OTHER PUBLICATIONS

"Multi-Field Packet Classification Using Ternary CAM," Electronics Letters, Jan. 3, 2002, vol. 38, No. 1, pp. 21-23.
"Ternary CAM with Range Match Capacities," Research Disclosure, Apr. 2001, p. 651.
"Hybrid Direct Table and LPM Searches," Research Disclosure, Mar. 2001, p. 456.
"Ternary Read-Only Memory," IBM Technical Disclosure Bulletin, Sep. 1971, vol. 14, No. 4, pp. 1337-1338.

* cited by examiner

*Primary Examiner*—Wilson Lee
*Assistant Examiner*—Michael Le
(74) *Attorney, Agent, or Firm*—Sawyer Law Group LLP

(57) ABSTRACT

The present invention relates to a method and system for compressing a tree structure. The method of the present invention includes providing a compressed format block for representing a plurality of levels of the tree structure, where the plurality of levels comprises a set of nodes. The method also includes compressing each node in the set of nodes into the compressed format block, such that the plurality of levels is traversed in a single memory access.

11 Claims, 7 Drawing Sheets

Uncompressed tree structure 500

Compressed Format Block 500'

SYSTEM FOR COMPRESSING A SEARCH TREE STRUCTURE USED IN RULE CLASSIFICATION

FIELD OF THE INVENTION

The present invention relates to computer systems, and more particularly to a method and system for compressing a search tree structure used in rule classification.

BACKGROUND OF THE INVENTION

FIG. 1 depicts conventional networks 10 and 20 which may be connected to the Internet 30. Each network 10 and 20 includes host 12, 14 and 16 and 22 and 24, respectively. Each network 10 and 20 also includes a switch 18 and 26, respectively, and may include one or more servers such as the servers 17, 19 and 28, respectively. In addition, each network 10 and 20 may include one or more gateways 13 and 25, respectively, to the Internet 30. Not explicitly shown are routers and other portions of the networks 10 and 20 which may also control traffic through the networks 10 and 20 and which will be considered to be inherently depicted by the switches 18 and 26, respectively, and the networks 10 and 20 in general.

FIG. 2 depicts a portion of a typical switch 50, which may be used for the switches 18 and 26 (FIG. 1) and/or a router (not shown). The switch 50 includes a network processor 52 and storage 54. The switch 50 typically also includes other components (not shown). The network processor 52 manages functions of the switch 50, including the classification of packets using the rules described below. The storage 54 retains data relating to the rules.

Referring to FIGS. 1 and 2, in order to manage communications in a network, such as the network 10 or 20, filter rules are used. Filter rules are typically employed by switches, routers and other portions of the network to perform packet classification. Each filter rule is used to classify packets which are being transmitted via a network in order to determine how the packet should be treated and what services should be performed. For example, a filter rule may be used in testing packets entering the network from an outside source to ensure that attempts to break into the network can be thwarted. For example, traffic from the Internet 30 entering the network 10 may be tested in order to ensure that packets from unauthorized sources are denied entrance.

Similarly, packets from one portion of a network may be prevented from accessing another portion of the network. For example, a packet from some of the hosts 12, 14 or 16 may be prevented access to either the server 17 or the server 19. The fact that the host attempted to contact the server may also be recorded so that appropriate action can be taken by the owner of the network.

Such filter rules may also be used to transmit traffic based on the priorities of packets. For example, packets from a particular host, such as the host 12, may be transmitted because the packets have higher priority even when packets from the hosts 14 or 16 may be dropped. The filter rules may also be used to ensure that new sessions are not permitted to be started when congestion is high even though traffic from established sessions is transmitted. Other functions could be achieved based on the filter rule as is well known to those skilled in the art.

In order to determine whether a particular rule will operate on a particular packet, a key is tested. The key typically includes selected fields, known collectively as the TCP/IP 5-tuple or just the 5-tuple, extracted from the Internet Protocol (IP) and TCP headers of the packet. The IP and TCP headers typically contain five fields of interest: the source address (SA), the destination address (DA), the source port (SP), the destination port (DP) and the protocol. These fields are typically thirty-two bits, thirty-two bits, sixteen bits, sixteen bits and eight bits, respectively. Rules typically operate on one or more of these fields. For example, based on the source and/or destination addresses, the rule may determine whether a packet from a particular host is allowed to reach a particular destination address. In addition to the fields of the TCP/IP 5-tuple, those skilled in the art appreciate that the key can include additional fields that determine how traffic is managed through the network for example. Thus, the filter rules typically operate using a key that includes at least some fields of the IP header of a packet and may include additional bits.

In testing a key against a filter rule, it is determined whether the filter rule should be enforced against the packet associated with the key. The key is tested by comparing specified fields for the key of the packet with a range(s) of values defined by the filter rule. Each rule contains a range of values in one or more dimensions. Each dimension corresponds to a field of the key (typically the IP header). One type of filter rule has a range consisting of a single value or a spread of values. In such a case, a "Range-rule" search is performed to determine whether the key exactly matches the value for the rule. Other rules have ranges which can be expressed using a single prefix. The prefix is a binary number containing a number of ones and zeroes (1 or 0), followed by place holders, or wildcards (*). In this case, a "Wildcard-match" is performed to determine whether the rule applies to the packet.

Testing the key against a filter rule can be a tedious and time consuming procedure, which is multiplied several times over when the number of filter rules increases. In order to expedite this process, a search facility known as a "Software-managed tree" (SMT) search engine is utilized. Generally, the SMT search engine analyzes a collection of filter rules, and based on the rules' conditions, builds a plurality of binary tree structures. Each tree structure is a binary tree that includes a series of hierarchical single bit test nodes and leaf nodes. At each single bit test node, a specified bit of the key is tested, and depending on the value of the test bit, a path is followed, which terminates at a leaf. Each leaf includes a filter rule that includes the rule specification and defines an action to be taken with regard to a packet. The SMT search engine is described in more detail in U.S. Pat. No. 6,298,340, entitled, "SYSTEM AND METHOD AND COMPUTER PROGRAM FROM FILTERING USING TREE STRUCTURE" issued on Oct. 2, 2001, and assigned to the assignee of the present invention.

The SMT search engine enables a search on multiple fields within the key, and within each field, looks for either a pattern under a mask (Wildcard match), or a range specified by a minimum or a maximum (Range-rule), as the criteria for declaring a match. The search engine can utilize standard memory structures resulting in an economical implementation. Nevertheless, utilizing such memory structures presents issues. For example, characteristics of the tree structures contribute to excessive latency in completing the searches and contribute to an inefficient use of storage space. Thus, utilizing standard memory structures, while economical, makes it very difficult to support multi-field classification in an SMT engine.

Current solutions to this issue include utilizing a ternary content addressable memory (TCAM). TCAMs include logic, such as a comparator, for each location. The logic allows the entries of the TCAM to be searched in parallel. Nevertheless, although TCAMs provide high-performance multi-field classification, they also add significant costs to a system.

Accordingly, what is needed is a system and method for providing high-performance multi-field classification utilizing standard memory structures. The system and method should implement an improved search facility that maintains the cost advantage of using standard memory structures, while improving performance to approach that of more expensive solutions. The present invention addresses such a need.

SUMMARY OF THE INVENTION

The present invention relates to a method and system for compressing a tree structure used in rule classification. The method of the present invention includes providing a compressed format block for representing a plurality of levels of the tree structure, where the plurality of levels comprises a set of nodes. The method also includes compressing each node in the set of nodes into the compressed format block, such that the plurality of levels is traversed in a single memory access.

Through aspects of the method and system of the present invention, single bit test nodes in multiple levels of a binary tree structure are compressed into the compressed format block. In addition, uncompressed child single test bit nodes and child leaf nodes are collected, ordered and stored into separate contiguous memory structures. The compressed format block provides pointers to each of the separate contiguous memory structures. By compressing the single bit test nodes in the multiple levels of the tree structure in such a way, the amount of memory consumed by the compressed portion of the tree structure is significantly reduced, and only one memory access, as opposed to multiple accesses, is required to navigate the compressed portion of the tree structure. Accordingly, with the method and system of the present invention, performance levels utilizing standard memory structures approach those in systems utilizing a ternary content addressable memory (TCAM).

DETAILED DESCRIPTION OF THE INVENTION

The present invention relates to computer systems, and more particularly to a method and system for compressing a tree structure used in rule classification. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. For example, although the present invention will be described in the context of filter rules, one of ordinary skill in the art will readily recognize that the method and system can operate effectively for other multi-field classification rules. Likewise, while the present invention is described in the context of a DRAM memory subsystem, one of ordinary skill in the art will readily recognize that the method and system can operate effectively for other types of memory subsystems (e.g., SRAM). Thus, the present invention is not intended to be limited to the embodiment shown, but is to be accorded the widest scope consistent with the principles and features described herein.

Figure 1:
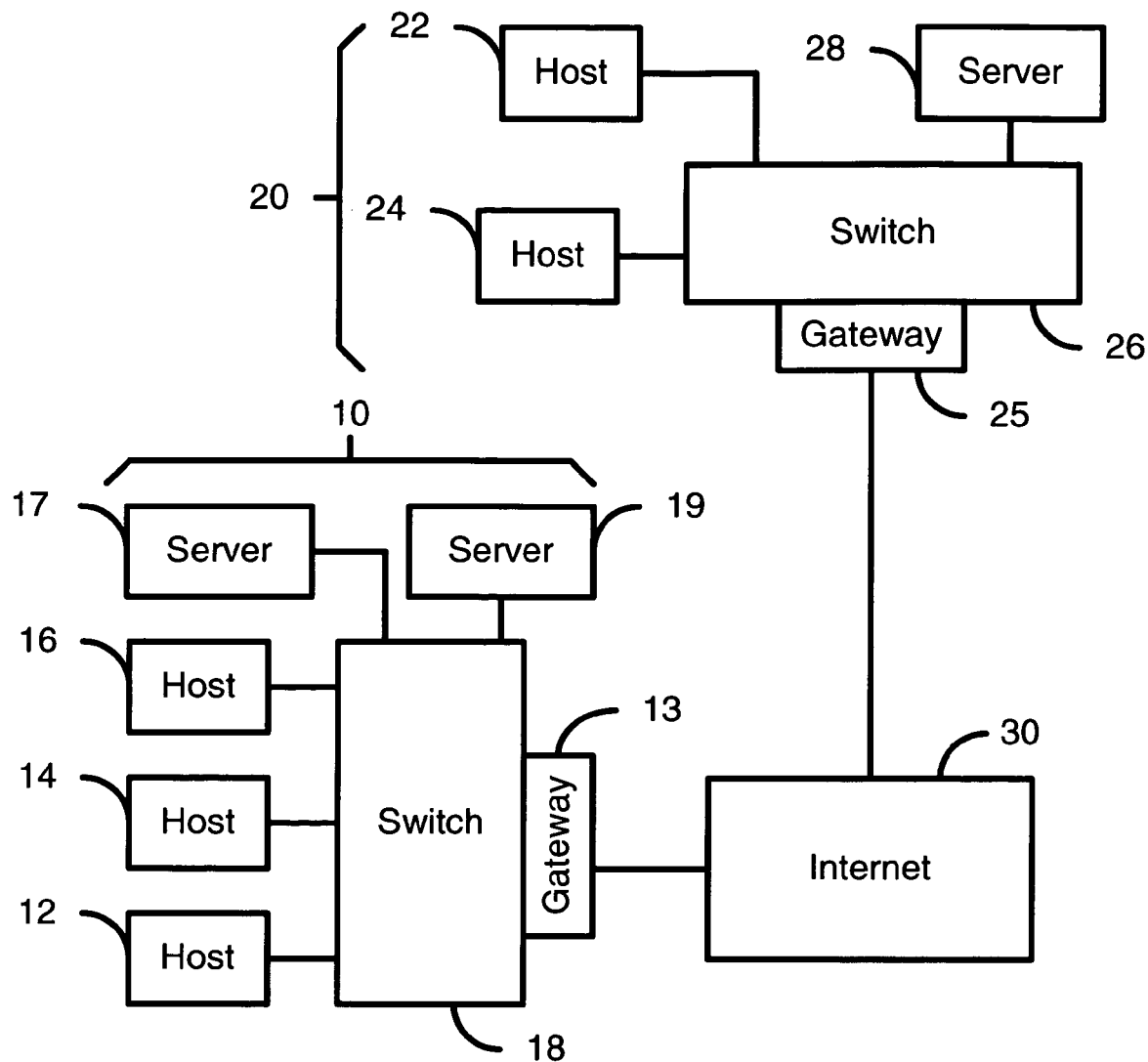
FIG. 1 is a diagram of computer systems of networks in which the present invention can be used.
Figure 2:
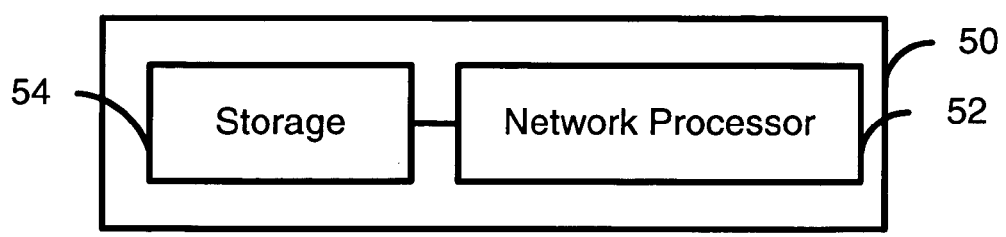
FIG. 2 is a diagram of a switch in which the present invention can be used.
Figure 3:
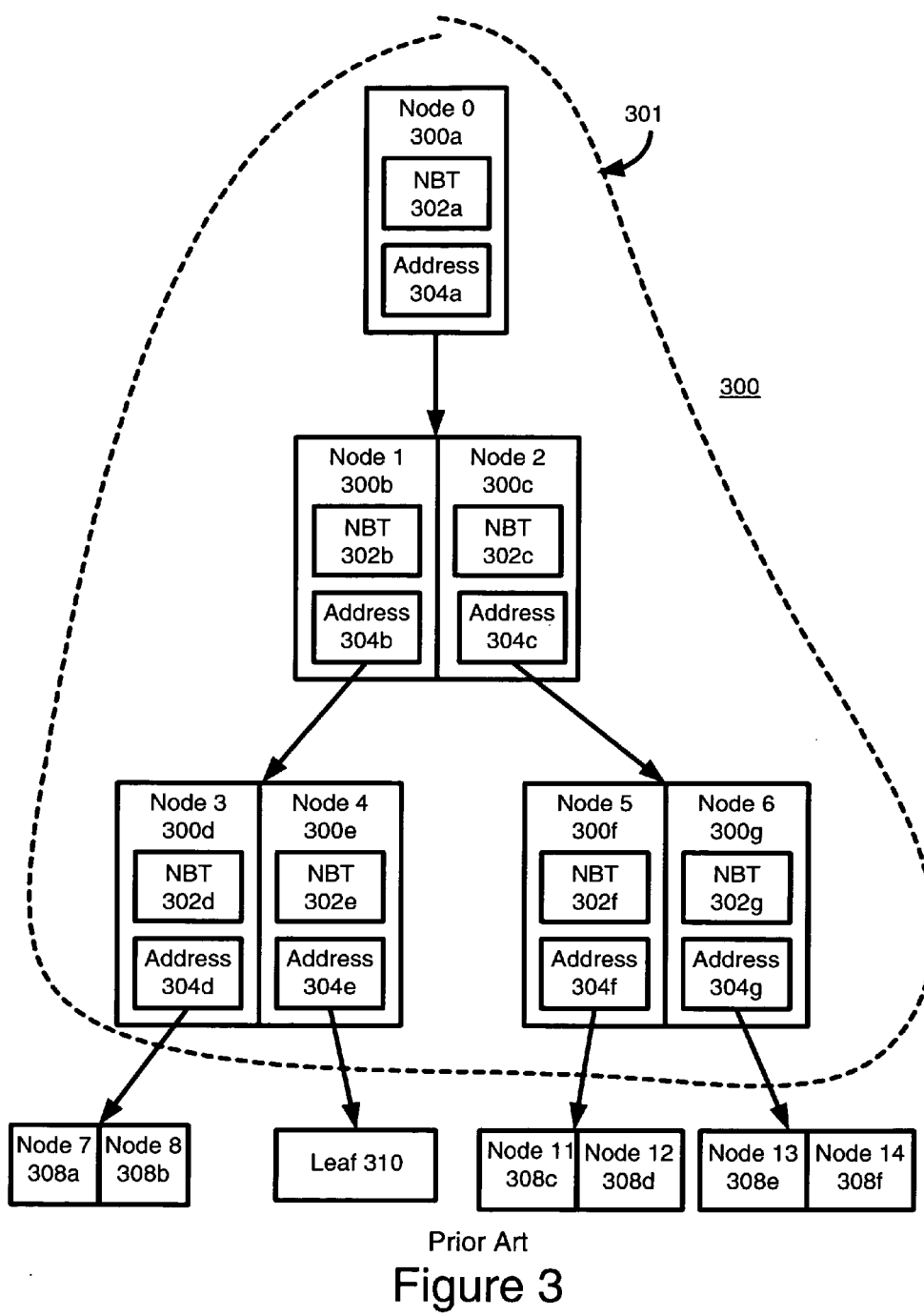
FIG. 3 is a block diagram of an SMT binary tree structure.

FIG. 3 is a block diagram of an SMT binary search tree structure 300. As is shown, the tree structure 300 comprises a plurality of single bit test nodes, referred to as pattern search control block (PSCB) nodes, e.g., 300a-300g, and leaf nodes, e.g., 310. Although only 12 PSCBs and one leaf are depicted, those skilled in t structure 300 can include fewer than or greater than 12 PSCBs and one leaf, and that the tree structure 300 depicted in FIG. 3 is merely illustrative. Also, the tree structure 300 in FIG. 3 does not necessarily begin with PSCB Node 0 (300a), i.e., PSCB Node 0 (300a) is not necessarily the root node of the tree structure. Indeed, it is plausible that PSCB Node 0 (300a) is but one of several PSCBs in one level of the tree structure and that the larger tree structure extends above and below PSCB Node 0 (300a). Each PSCB node, e.g., 300a-300g, is typically 36 bits and includes a Next Bit to Test (NBT) field (e.g., NBT 302a-302g) and an address field (e.g., address 304a-304g). The NBT field 302a indicates which bit in the key to test. The address field 304a includes a pointer that points to either a pair of PSCB nodes, e.g., 300b, 300c, or a leaf, e.g., 310. Pointers that point to PSCBs are referred to as next pattern address (NPA) pointers, and pointers that point to a leaf are referred to as leaf control block address (LCBA) pointers. For example, the address field 304a for PSCB Node 0 (300a) includes an NPA pointer to a pair of PSCB nodes, Node 1 (300b) and PSCB Node 2 (300c), which are stored in adjacent address spaces. Which PSCB node to follow depends on the value of the key bit indicated by the NBT field 302a. Inevitably, a PSCB node, e.g., 300e, includes an LCBA pointer that points to a leaf 310. As stated above, the leaf 310 includes the filter rule that defines the action to be taken with regard to a packet.

Depending on the number of classification rules and other factors, the SMT tree structure 300 can be much more complex than the tree structure 300 depicted in FIG. 3, including numerous PSCBs 300a-300g, 308a-308f and leafs 310. As stated above, each PSCB 300a consumes at least 36 bits, so that in a simple two level tree structure comprising seven (7) PSCB nodes, 252 bits are consumed. Moreover, during the search process, typically one memory access is required for each level navigated in the tree structure 300. Thus, for the simple tree structure in FIG. 3, three memory accesses would be required to traverse three levels of the tree structure 300 in order to reach the leaf node 310. Accordingly, the existing binary tree structure 300 depicted in FIG. 3 contributes to excessive latency, and also inefficiently utilizes memory.

According to a preferred embodiment of the present invention, a method and system is provided for improving latency and memory utilization by compressing PSCB nodes in multiple levels of the tree structure 300 into a compressed PSCB format block, such that the multiple levels can be traversed in a single memory access. Moreover, the method and system of the present invention collects and stores the child PSCB nodes of the compressed PSCB nodes in the lowest level, referred to simply as "child PSCB nodes," in a contiguous memory structure. Similarly, child leaf nodes of compressed PSCB nodes are collected and stored in a second contiguous memory structure. The compressed PSCB format block provides a first pointer to a base address of the contiguous memory structure of child PSCB nodes, and a second pointer to a base address of the contiguous memory structure of leafs, thereby eliminating each of the individual address fields 304a-304g in the uncompressed PSCB nodes. By compressing the PSCB nodes in the multiple levels of the tree structure in such a way, the amount of memory consumed by the compressed portion of the tree structure 301 is significantly reduced, and a single memory access is needed in order to navigate the compressed portion of the tree structure 301, thereby reducing latency.

Figure 4:
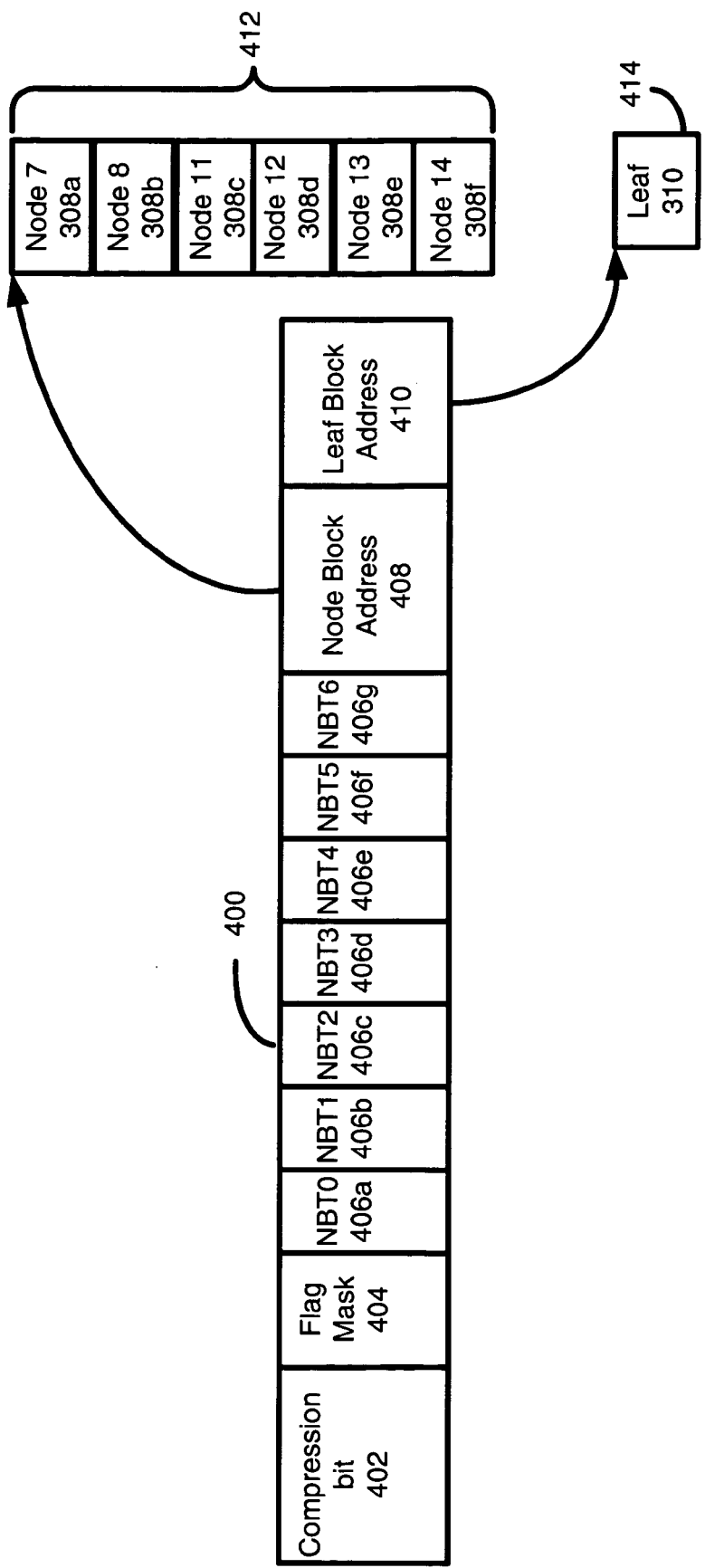
FIG. 4 is a block diagram of a compressed PSCB format block according to a preferred embodiment of the present invention.

To describe more fully the method and system of the present invention, please refer to FIG. 4, which is a block diagram of the compressed format block 400 according to a preferred embodiment of the present invention. The compressed format block 400 represents the levels of the tree structure within the dotted line 301, i.e., levels 0-2 which include PSCB Nodes 0-6 (300a-300g), in FIG. 3. As stated above, the outlined portion of the tree structure 301 can be at the top of the tree structure 300, i.e., PSCB Node 0 (300a) is the root node, in which case, the compressed format block 400 would be an entry in a Direct Table (DT) that includes entry points to each of the plurality of binary tree structures. Alternatively, the outlined portion 301 can be a sub-tree structure within a larger tree structure. Preferably, the compressed format block 400 is a 16 byte entry, corresponding to one access of a single bank or two adjacent banks in DRAM, depending on the bus width of the DRAM. For example, assuming a burst length of four (4) on the DRAM, a 16 bit bus would supply 8 bytes per bank burst, while a 32 bit bus would supply 16 bytes per bank burst. Alternatively, the compressed format block 400 can be read from SRAM, four (4) bytes at a time requiring four (4) clock cycles. Thus, in a preferred embodiment, the compressed format block 400 represents two levels of a tree structure including up to seven (7) PSCB nodes. In a second preferred embodiment, the compressed format block is a 32 byte entry which can represent three levels including up to 15 PSCB nodes.

The compressed format block 400 includes a compression bit field 402, a flag mask field 404, a plurality of NBT fields 406a-406g, a node block address field 408 and a leaf block address field 410. The compression bit field 402 includes a bit whose value indicates to a search engine whether the block is a compressed representation of the tree structure 301 or a PSCB node, 300a. The flag mask field 404 includes a plurality of flag bits, where each flag bit corresponds to a PSCB node, e.g., 300a, in the binary tree structure 301. The bit value identifies the type of pointer, e.g., NPA or LCBA, in the address field, e.g., 304a, of the corresponding uncompressed PSCB node 300a. Thus, for example, if the first flag bit in the flag mask field 404 corresponds to PSCB Node 0 (300a), the value of the flag bit will be zero (0) because the pointer in the address field 304a points to PSCB Node 1 (300b) and PSCB Node 2 (300c). Whereas, if the fifth bit in the flag mask field 404 corresponds to PSCB Node 4 (300e), the value of the flag bit will be one (1) because the pointer in the address field 304e is an LCBA pointer pointing to the leaf 310. The flag bits are used to traverse the compressed levels of the binary tree structure 301, and are also used to determine an address of child PSCB node or leaf node.

Each of the plurality of NBT fields, e.g., 406a, corresponds to a PSCB node 300a in the compressed levels of the binary tree structure 301. Each NBT field 406a in the compressed PSCB format block stores the value of the corresponding NBT field 302a in the uncompressed PSCB node 300a.

The node block address field 408 includes an NPA pointer pointing to a base address of a PSCB node block 412 where child PSCB nodes 308a-308f are ordered and located. According to a preferred embodiment of the present invention, child PSCB nodes 308a-308f may have parent nodes that are either compressed PSCB nodes or uncompressed PSCB nodes in a level above of the tree structure 301. Child PSCB nodes 308a-308f are collected and ordered in adjacent address spaces in the PSCB node block 412, which is a contiguous memory structure. For example, if PSCB Node 7 (308a) is located at a base address (A) of the PSCB node block 412, the location of PSCB Node 8 (308b) is the entry adjacent to PSCB Node 7 (308a) and easily identified by the base address (A) incremented by an offset of one (A+1). The location of PSCB Node 9 (308c) is adjacent to PSCB Node 8 (308b) and is identified by the base address incremented by an offset of two (A+2) and so forth. Accordingly, the location of each child PSCB node (308a-308f) within the PSCB node block 412 can be identified by the NPA pointer in the node block address 408, which points to the base address of the structure 412, and a small PSCB offset value.

Similarly, the leaf block address field 410 includes an LCBA pointer pointing to a base address of a leaf block 414 where child leaf nodes 310 are organized and located in a contiguous memory structure. Thus, if any child of the compressed PSCB nodes 300a-300g is a leaf node, the location of that leaf node 310 is identified by the LCBA pointer in the leaf block address field 410, which points to the base address of the leaf block 414, and a small offset value.

By organizing and storing the child PSCB nodes 308a-308f and child leafs 310 in the PSCB node block 412 and leaf block 414, respectively, and providing a pointer to the base address of each block 412, 414, individual pointers to the child PSCB nodes 308a-308f and child leaf nodes 310 are reduced to a small offset value. In this manner, the memory required to describe the compressed levels of the tree structure 301 represented by the compressed format block 400 is significantly reduced. Moreover, by compressing the multiple levels of the tree structure 301 into the compressed format block 400, those levels of the tree structure 301 can be navigated during a single memory access, thereby reducing latency.

In the above described embodiment, a child PSCB node, e.g., 308a, is an uncompressed PSCB node, e.g., Node 7. In an alternative embodiment, the child PSCB node 308a is replaced with a child compressed PSCB format block representing a next lower portion of the tree structure, where the single (root) node at level zero is the child PSCB node 308a. In this manner, every PSCB node in the entire tree structure, and not just a portion, can be compressed into a plurality of linked compressed format blocks, thereby further reducing latency and the number of bytes required to describe the tree structure.

Figure 5A:
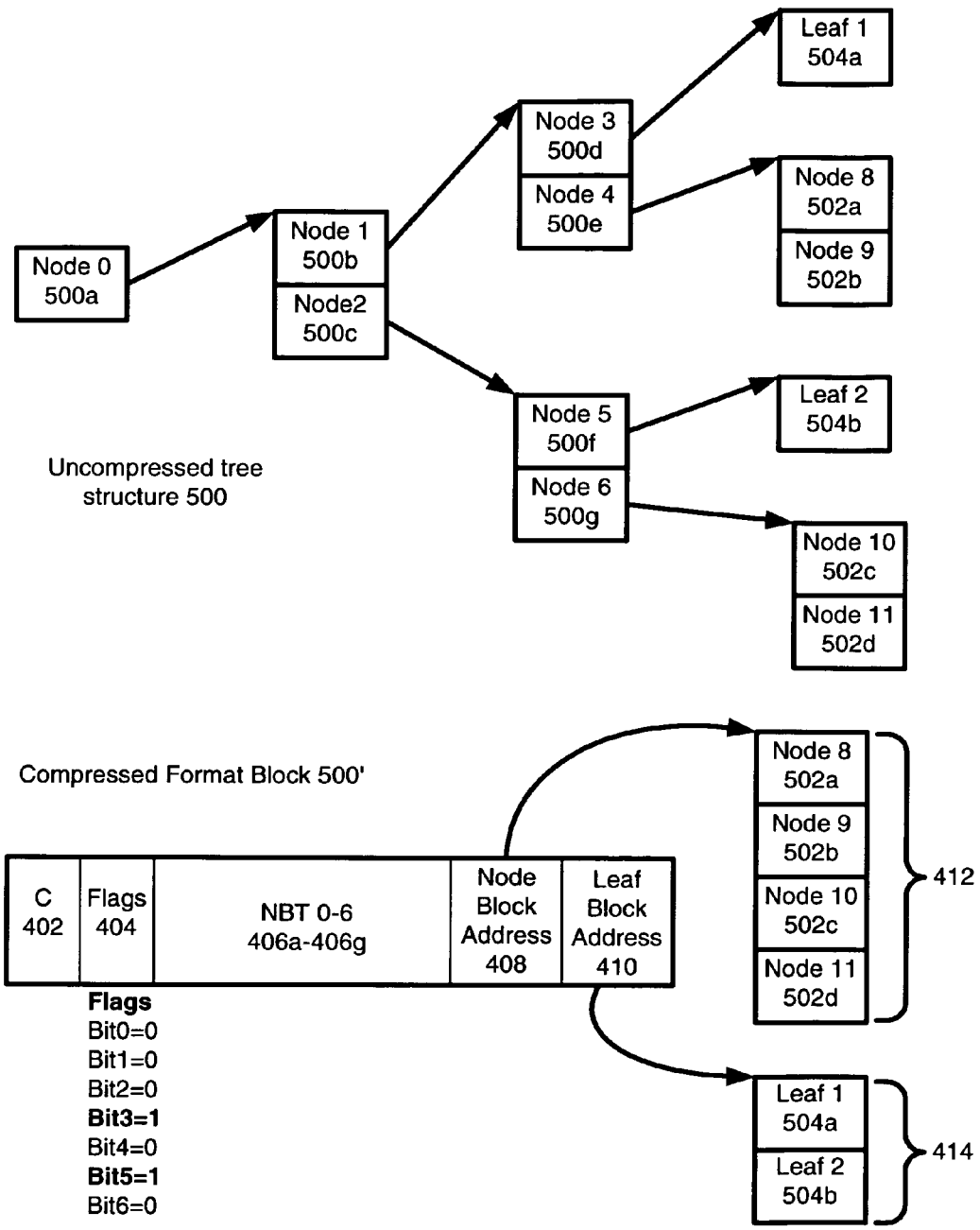
FIGS. 5A, 5B and 5C are exemplary block diagrams of uncompressed binary tree structures and their respective compressed format blocks according to a preferred embodiment of the present invention.
Figure 5B:
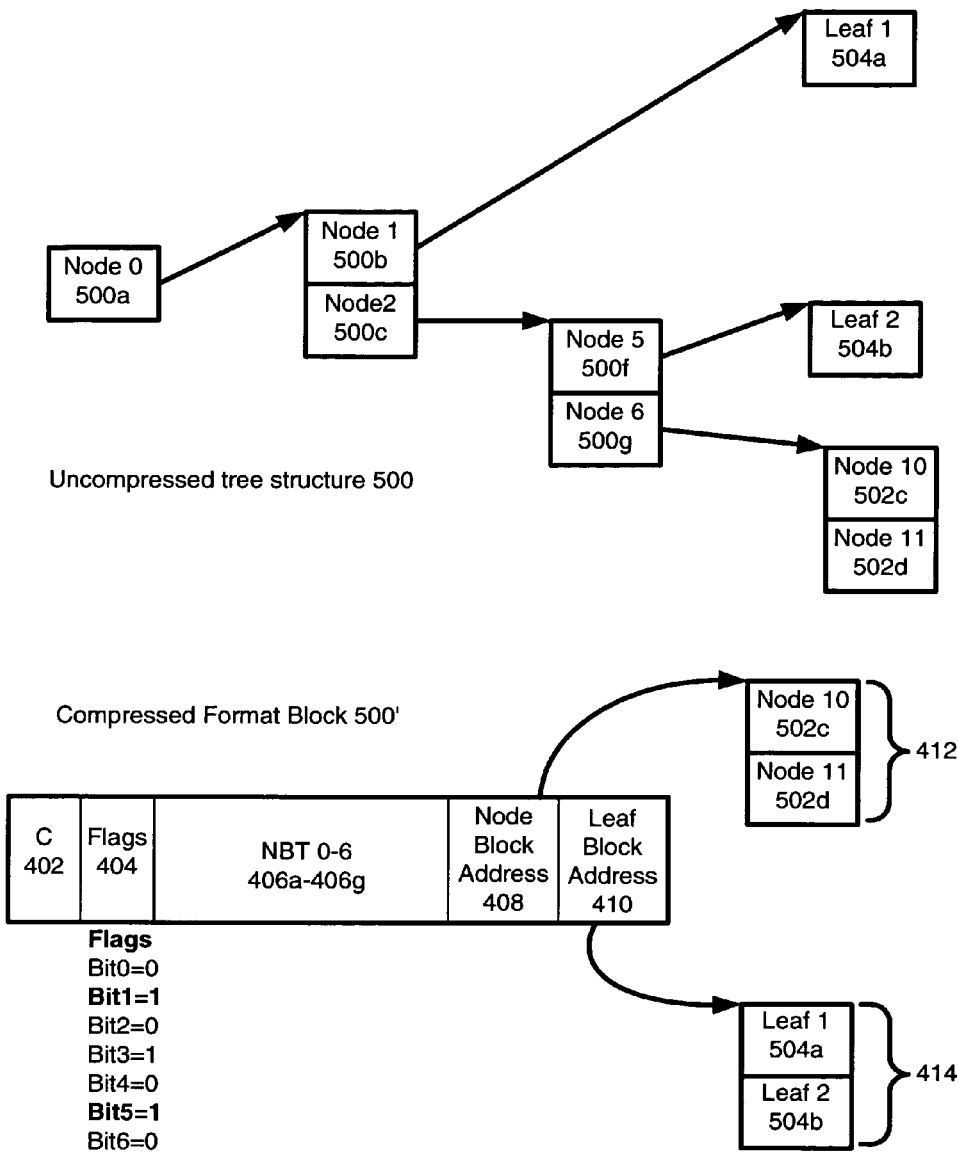
Figure 5C:
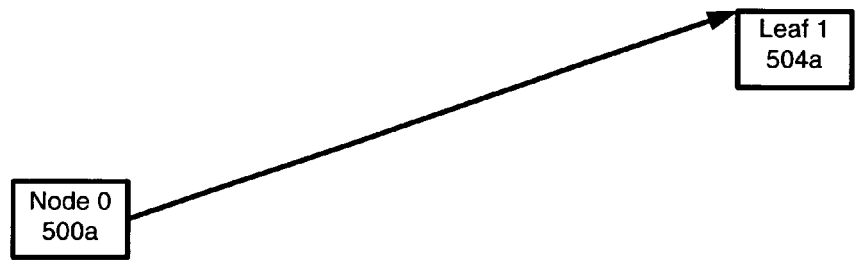
Figure 5C:
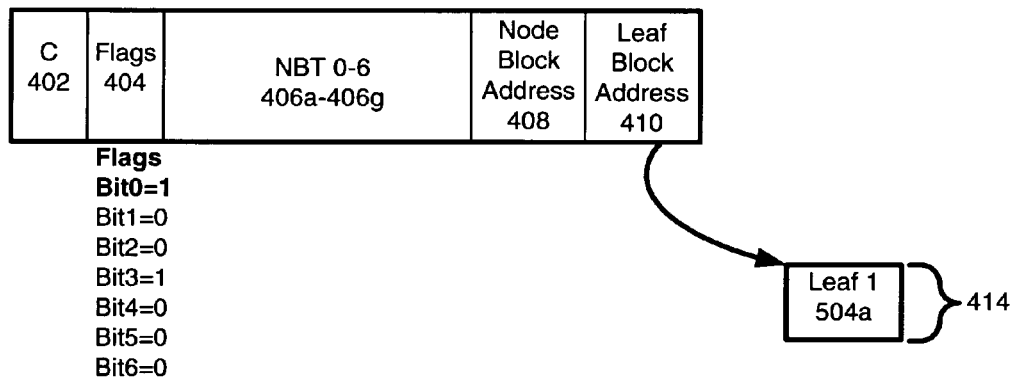

FIGS. 5A, 5B and 5C are exemplary block diagrams of uncompressed tree structures and their respective compressed PSCB format blocks according to a preferred embodiment of the present invention. In FIG. 5A, flag bit3 and flag bit5 in the flag mask 404 are set to one (1), which indicates that the corresponding nodes, PSCB Node 3 (500d) and PSCB Node 5 (500f), in the uncompressed tree 500 have LCBA pointers pointing to child Leaf 1 (504 a) and child Leaf 2 (504b), respectively. All the other bits in the flag mask 404 are set to zero (0), indicating that the corresponding PSCB nodes have NPA pointers pointing to other PSCB nodes. For example, PSCB Node 4 (500e) points to PSCB Node 8 (502a). As is shown, the child PSCB nodes 502a-502d are stored in the PSCB node block 412 in order, and the child leaf nodes 504a, 504b are similarly stored in the leaf block 414 in order. FIGS. 5B and 5C are additional examples of different binary tree structures 500 and their corresponding compressed format blocks 500'.

Figure 6:
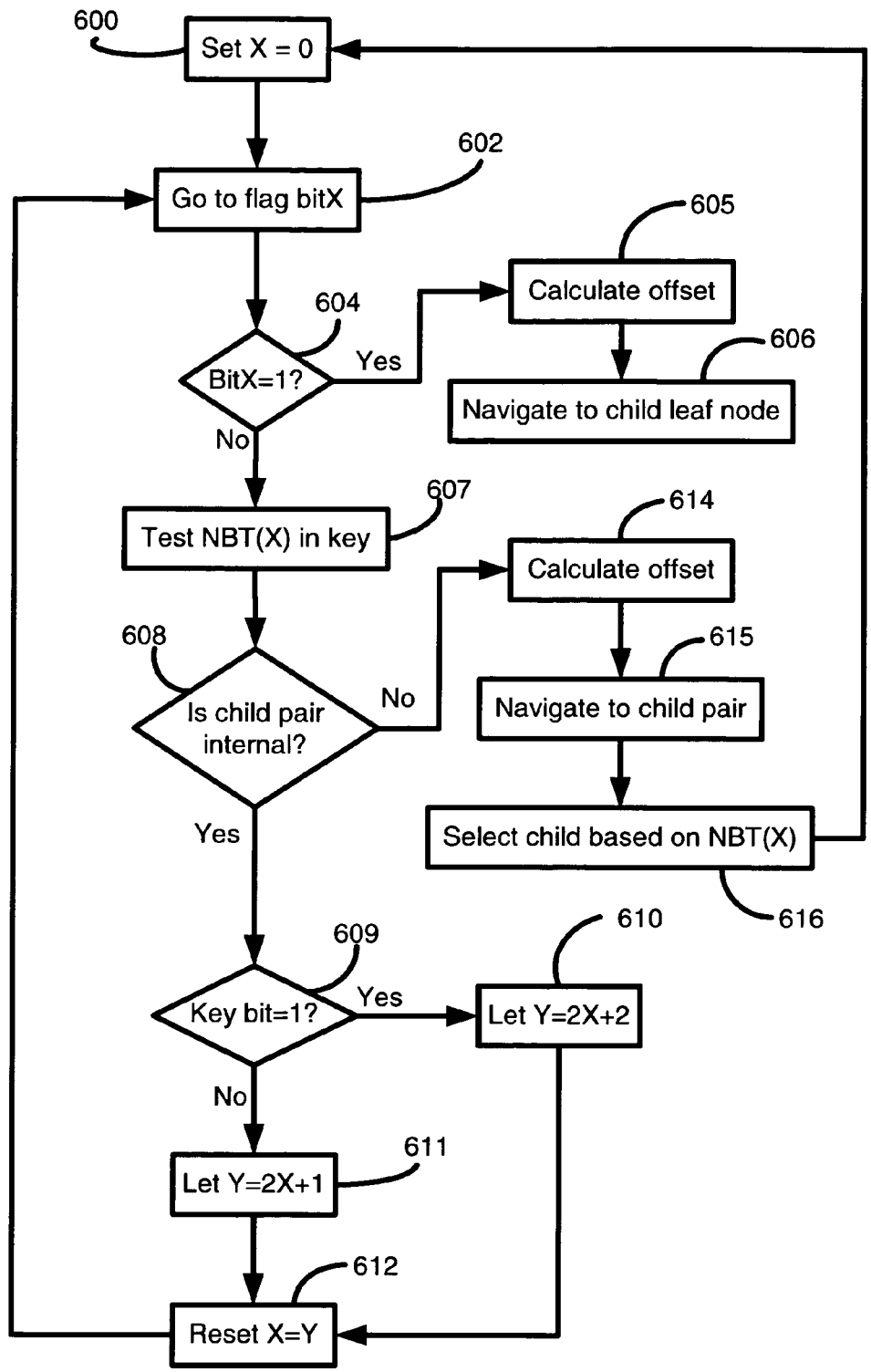
FIG. 6 is a flowchart illustrating a method for navigating through multiple levels of a tree structure using the compressed format block according to a preferred embodiment of the present invention.

FIG. 6 is a flowchart illustrating a method for navigating through multiple levels of a tree structure using the compressed format block 400 according to a preferred embodiment of the present invention. Referring to FIGS. 5A, 5B, 5C and 6 together, the navigation process begins by starting with a first compressed format block 500.' The first compressed format block is preferably an entry in the Direct Table, but can also be located elsewhere in the tree structure.

In step 600, an index, X, is set to zero (0). Next, in step 602, flag bitX in the flag mask 404 is examined. If the value of flag bitX equals one (1) (step 604), e.g., see FIG. 5C, it indicates that the pointer in the corresponding PSCB node 500a points to a leaf 504a. Therefore, if the value of the flag bitX equals one (1), the search engine calculates a leaf offset (step 605) and navigates to the child leaf node 504a in the leaf block 414 (step 606) by reading the LCBS pointer in the leaf block address field 410 and applying the calculated leaf offset. The table data located in the corresponding child leaf node, e.g., 504a, is returned.

Note that the leaf offset for a particular child leaf 504a is proportional to the number of flag bits between flag bit0 and flag bit(X-1) that are set to one (1). For example, in FIG. 5B, flag bit5 is set to 1 indicating that uncompressed PSCB Node 5 (500f) points to a child leaf 504b. The number of flag bits set to one between bit0 and bit4 is one (1). Therefore, the search engine navigates to the base address of the leaf block 414 and applies one (1) offset, which points to the entry for the child leaf 504b.

Referring back to FIG. 6, if the value of flag bit(X) is not equal to one (1) (step 604), i.e., bit(X)=0, then the corresponding PSCB node, e.g., 500a (FIGS. 5A or 5B) points to a pair of child PSCB nodes (500b, 500c). In this case, the value of the key bit identified in the corresponding NBT (X) field, e.g., 406a, is tested (step 607) to determine which of the pair of child PSCB nodes (500b or 500c) to traverse. In step 608, it is determined whether the child PSCB node pair (500b, 500c) is internal to the compressed portion of the tree structure 301 or outside of the structure 301. The child node pair is internal if:

$$X < 0.5\ (N-1),$$

where N is a maximum number of PSCB nodes that can be represented by the compressed format. N is dependent on the memory structure, e.g., bus width and burst length. For example, if the compressed format block is a 16 byte entry, the maximum number of PSCB nodes that can be represented is seven (7), whereas if the compressed format block is a 32 byte entry, the maximum number of PSCB nodes that can be represented is 15. Thus, assuming a 16 byte entry, if the index, X, is less than three (3), then the child node pair is internal.

If the child node pair is compressed, it is determined whether the value of the tested key bit is equal to one (1) (step 609). If it is, a value Y is defined as (2X+2) in step 610, whereas if the value of the tested key bit is not one (1), the value Y is defined as (2X+1) in step 611. In step 612, the index X is reset to the value Y, and steps 602 through 612 are repeated. If the child node pair is not compressed (step 608), then the engine calculates a PSCB offset in step 614. The PSCB offset is equal to twice the number of flag bits between flag bit((N-1)/2) and flag bit(X-1) that are set to zero (0), where N is the maximum number of PSCB nodes that can be represented by the compressed format. For example, in FIG. 5A, flag bit 6 is set to zero (0) indicating that corresponding PSCB Node 6 (500g) points to an uncompressed child PSCB node pair 502c, 502d. The number of flag bits set to zero (0) between bit3 and bit5 is one (1) and therefore the PSCB offset for the child PSCB node pair is two (2). The search engine then navigates to the child node pair (502c, 502d) in the node block 412 (step 615) by reading the NPA pointer in the node block address field 408 and applying the calculated PSCB offset. The entry corresponding to the appropriate child node (502c or 502d) is selected (step 616) based on the value of the tested key. For example, if the tested key for Node 6 is equal to zero (0), the entry selected corresponds to Node 10 (502c).

The search engine reads the data in the entry and if the entry data is a child compressed PSCB format block, steps 600-616 are repeated for the child compressed PSCB format block. If the entry data corresponds to a PSCB node, e.g., Node 8 502a in FIG. 5A, the search engine will perform the key bit test as normal. Accordingly, in this manner, an entire binary tree structure can be represented by a plurality of hierarchical compressed PSCB format blocks, and the number of memory accesses needed to traverse tree structure can be reduced significantly (up to three times fewer memory accesses for a 16 byte entry).

A method and system has been disclosed for decreasing latency and improving memory utilization in a search engine navigating an SMT binary tree structure. According to a preferred embodiment, PSCB nodes in multiple levels of the binary tree structure 301 are compressed into a compressed PSCB format block 400 and uncompressed child PSCB nodes are collected, ordered and stored into a contiguous memory structure. The compressed format block provides one pointer to a base address of a PSCB node block comprising the child PSCB nodes and/or child compressed PSCB format blocks. The compressed PSCB format block also includes one pointer to a base address of a leaf block comprising child leaf nodes of the compressed PSCB nodes. By compressing the PSCB nodes in the multiple levels of the tree structure in such a way, the amount of memory consumed by the compressed portion of the tree structure 301 is significantly reduced, and only one memory access, as opposed to multiple accesses, is required to navigate the compressed portion of the tree structure 301. Accordingly, the search performance is significantly improved and approaches that of more expensive solutions utilizing TCAMs for example.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A classification system comprising:
a communications network;
a switch in the communications network;
a network processor in the switch for classifying packets of information based on filter rules, the network processor being programmed to compress a tree structure comprising multiple levels of single bit test nodes and leaf nodes, the tree structure having been previously built from the filter rules in which each leaf node of the tree structure includes a given filter rule for classifying a given packet; and
a storage in the switch for storing the compressed tree structure in a first memory structure of the storage such that the multiple levels of single bit test nodes and leaf nodes can be accessed from the first memory structure through a single memory access of the storage,
wherein the network processor further
collects single bit test nodes of the tree structure that are in a lowest level of the tree structure and separately stores only the collected single bit test nodes of the tree structure that are in the lowest level in a second memory structure of the storage that is contiguous with the first memory structure, and
collects each leaf node of the tree structure and stores only the collected leaf nodes within a third memory structure of the storage that is contiguous to the second memory structure.

2. The classification system of claim 1, wherein:
the compressed tree structure in the first memory structure includes a first pointer to a base address of the second memory structure that is contiguous to the first memory structure; and
the compressed tree structure in the first memory structure further includes a second pointer to a base address of the third memory structure that is contiguous to the second memory structure.

3. The classification system of claim 2 wherein the filter rules are used by the switch in the communications network to perform one or more of transmitting packets based on a priority associated with the packets, determining a service is to be performed on packets, testing packets entering the communications network from an outside source to ensure that attempts to break into the communications network are prevented.

4. The classification system of claim 2 wherein the compressed tree structure stored in the first memory structure represents two levels of the tree structure and includes up to seven single bit test nodes of the tree structure.

5. The classification system of claim 4 wherein the compressed tree structure stored in the first memory structure consists of 16 bytes.

6. The classification system of claim 2, wherein the compressed tree structure stored in the first memory structure represents three levels of the tree structure and includes up to fifteen single bit test nodes of the tree structure.

7. The classification system of claim 6 wherein the compressed tree structure stored in the first memory structure consists of 32 bytes.

8. The classification system of claim 1 wherein each single bit test node corresponds to a pattern search control block (PSCB) of the tree structure.

9. The classification system of claim 1 wherein the tree structure comprises a software-managed tree (SMT).

10. The classification system of claim 1 wherein the storage comprises a dynamic random access memory (DRAM).

11. The classification system of claim 1, wherein the storage comprises a static random access memory (SRAM).

* * * * *